United States Patent
Brutti et al.

(10) Patent No.: US 6,521,047 B1
(45) Date of Patent: Feb. 18, 2003

(54) PROCESS AND APPARATUS FOR LIQUID DELIVERY INTO A CHEMICAL VAPOR DEPOSITION CHAMBER

(75) Inventors: Thierry Brutti, Le Touvet (FR); Benoit Pierret, Meylan (FR); Hervé Guillon, Meylan (FR)

(73) Assignee: Joint Industrial Processors for Electronics, Noyen sur Sarthe (FR)

( * ) Notice: Subject to any disclaimer, the term of this patent is extended or adjusted under 35 U.S.C. 154(b) by 197 days.

(21) Appl. No.: 09/694,682

(22) Filed: Oct. 24, 2000

(30) Foreign Application Priority Data

Nov. 8, 1999 (FR) .............................. 99 14246

(51) Int. Cl.$^7$ .............................................. C23C 16/00
(52) U.S. Cl. ..................... 118/726; 392/386; 392/394; 392/399
(58) Field of Search .......................... 118/726; 392/386, 392/394, 396, 397, 399; 122/40

(56) References Cited

U.S. PATENT DOCUMENTS

| | | | | |
|---|---|---|---|---|
| 4,924,936 A | * | 5/1990 | McKown | 118/715 |
| 5,372,754 A | * | 12/1994 | Ono | 118/726 |
| 5,536,321 A | * | 7/1996 | Olsen et al. | 118/715 |
| 5,707,415 A | * | 1/1998 | Cain | 118/726 |
| 5,835,678 A | * | 11/1998 | Li et al. | 118/726 |
| 5,945,162 A | | 8/1999 | Senateur et al. | 427/248.1 |
| 6,210,485 B1 | * | 4/2001 | Zhao et al. | 118/715 |
| 6,277,201 B1 | * | 8/2001 | Nishikawa | 118/723 VE |
| 6,367,414 B2 | * | 4/2002 | Witzman et al. | 118/718 |

FOREIGN PATENT DOCUMENTS

| | | |
|---|---|---|
| EP | 0763613 | 3/1997 |
| FR | 2800754 | * 11/1999 |
| WO | WO 92/03588 | * 3/1992 |
| WO | WO 96/20897 | 7/1996 |

* cited by examiner

*Primary Examiner*—Jeffrie R. Lund
(74) *Attorney, Agent, or Firm*—Oliff & Berridge, PLC (57) ABSTRACT

An apparatus for liquid delivery of a chemical vapour deposition CVD installation comprises an inlet head equipped with at least one injector having an inlet for delivery of liquid precursors or precursors in solution. A vector gas injection circuit is rendered active simultaneously with injection of the liquid, the vector gas being directed to the vicinity of the injector after being heated. Each injector is cooled individually by water or coolant flow. The evaporation chamber comprises heating resistances for the change of liquid/vapor state of the precursors, and deviation means arranged so that the distance covered by the droplets and vapours of the precursors is greater than the distance in a straight line between the nozzle of the injector and the outlet tube.

17 Claims, 11 Drawing Sheets

PROCESS AND APPARATUS FOR LIQUID DELIVERY INTO A CHEMICAL VAPOR DEPOSITION CHAMBER

BACKGROUND OF THE INVENTION

The invention relates to an apparatus for liquid delivery, in particular into a chemical vapour deposition CVD installation, or into a chemical vapour reaction reactor, comprising:

an inlet head equipped at least with one injector or spray nozzle having an inlet for delivery of liquid precursors or precursors in solution, a control circuit to periodically inject droplets of preset volume of the liquid precursors or a continuous or pulsed aerosol flow into an evaporation chamber, injection means for injecting a vector gas into said evaporation chamber, heating means designed to heat the evaporation chamber to achieve the change of liquid/vapour state of the liquid precursors, or of the solvent and precursor mixture, and an outlet tube designed to send the vaporised injected precursors to a reactor.

The CVD reactor is generally equipped with a pumping system or with a vent to create a vapour flow to the reactor.

STATE OF THE TECHNIQUE

The document FR-A-2,707,671 describes a process and apparatus for delivery of precursors into a chemical vapour deposition CVD enclosure. The deposition enclosure is divided into two parts by a porous material. The upper part constitutes the evaporator and the lower part at higher temperature forms the deposition chamber. The porous separator is made of steel wool, which lets the gas flow, and any droplets which have not been vaporised by the evaporator, pass. It is however of paramount importance in CVD processes that the whole of the injected liquid be evaporated before entering the deposition chamber.

The document WO 96 20897 describes an evaporator equipped with several channels filled with beads made of glass, metal or ceramic. When the liquid flows in the channels, it comes into contact with these beads which form obstacles.

OBJECT OF THE INVENTION

The object of the invention is to achieve an improved evaporation apparatus enabling optimum volatilisation of the liquid precursors or precursors in solution to be obtained after the injection phase, and preventing any internal condensation effect.

The apparatus according to the invention is characterized in that the inlet head comprises:

at least one orifice in the central part for insertion of the injector or of the spray nozzle, a circuit for injection and heating of the vector gas rendered active simultaneously with injection of the liquid, the vector gas being directed to the vicinity of the injector or nozzle, and cooling means for cooling the injector or nozzle, in particular by water or coolant flow or by air blowing.

According to one feature of the invention, the evaporation chamber contains deviation means arranged so that the distance covered by the droplets and vapours of the precursors is greater than the distance in a straight line between the nozzle of the injector and the outlet tube. The tube is subdivided into a plurality of elementary channels to increase the path and heating surface in the evaporation chamber. The tube can be made of metallic material, in particular stainless steel, or glass or quartz.

According to a preferred embodiment, the internal walls of the channels are covered with a chemically inert deposit, for example silicon carbide or tungsten, to prevent catalytic breakdown reactions of the vapours in contact with the metallic walls. Heating means surround the lateral surface of the tube coaxially and comprise resistances inserted in machined grooves arranged in two aluminium half-shells following exactly the same shape as the body of the evaporator so as to generate indirect heating of the tube. A first heating zone heats the upper flange and a second heating zone heats the tube and the lower flange, the temperature in each heating zone being controlled by a thermocouple.

According to one feature of the invention, each injector or spray nozzle has an individual cooling circuit, which is formed by an annular space filled with a coolant surrounding the body of the injector or spray nozzle.

According to another feature of the invention, a collar-piece extends up to the bottom face of the upper flange in the injection zone to minimize the surface accessible for back-streaming and condensation, the vector gas being injected into an annular volume arranged around the collar-piece where it expands and is heated before being reinjected into the space near to the nozzle of each injector or spray nozzle.

BRIEF DESCRIPTION OF THE DRAWINGS

Other advantages and features will become more clearly apparent from the following description of an embodiment of the invention given as a non-restrictive example only and represented in the accompanying drawings, in which.

DESCRIPTION OF A PREFERRED EMBODIMENT

With reference to FIGS. 1 to 5, an evaporator apparatus 10 for liquid delivery of thin layers into a chemical vapour deposition CVD chamber comprises an inlet head 12 connected to an outlet tube 14 via an evaporation chamber 16 in a vacuum or at atmospheric pressure.

Figure 1:
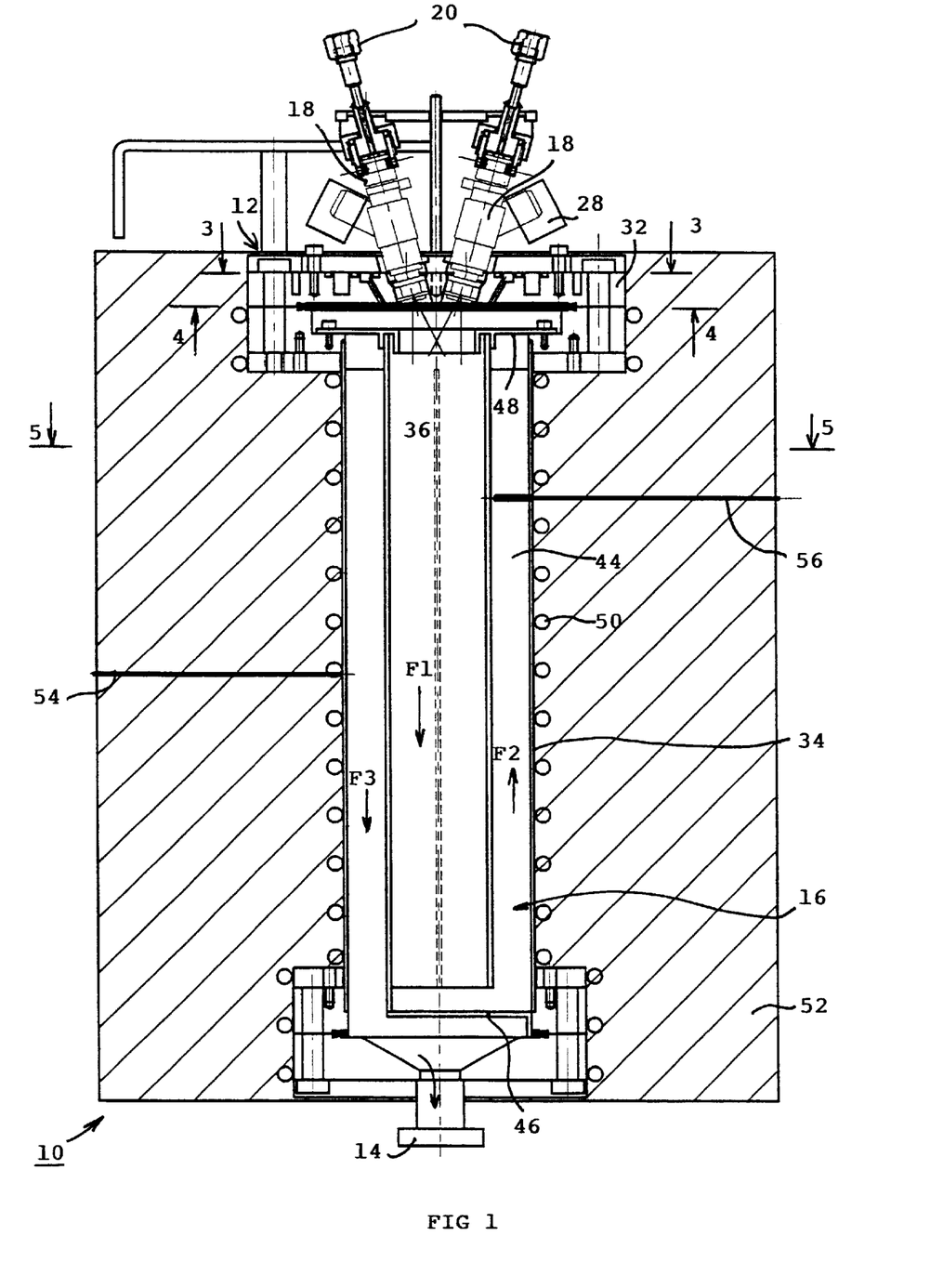
FIG. 1 is a longitudinal sectional view of the evaporator apparatus according to the invention, which is equipped with three injectors.

The inlet head 12 is equipped with at least one injector 18 having an inlet 20 connected to an external tank 22 filled with liquid precursors 24 or precursors in solution. The pressure in the tank 22 is greater than that present in the evaporation chamber 16, and each injector 18 periodically sends predetermined quantities of liquid 24 into the evaporation chamber 16, in which the liquid/vapour state change takes place. The injector 18 is formed by an electrovalve controlled on opening and closing by a microprocessor-based control circuit 26 connected to a connector 28 of the electrovalve. The injected liquid can be a pure liquid or a mixture of solvent and solute. The volume of liquid injected is perfectly controlled by the control circuit 26 and is reproducible. The injector 18 can also be replaced by a spray nozzle delivering a continuous or pulsed aerosol flow. In this case, a liquid regulating flowmeter is fitted between the tank 22 and the nozzle.

Figure 2:
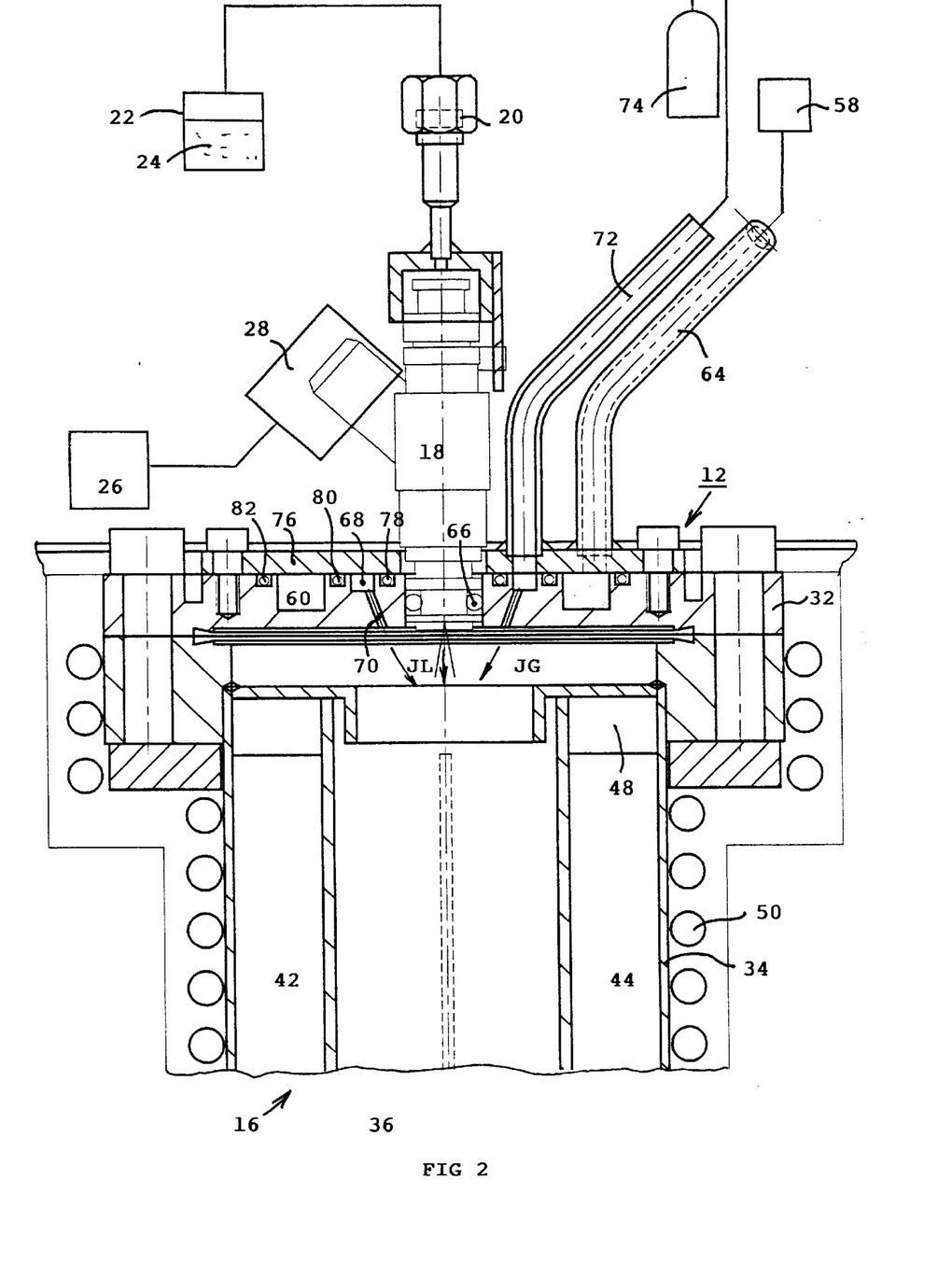
FIG. 2 shows a cross-sectional view on an enlarged scale of the inlet head equipped with a single injector.

FIG. 2 shows an inlet head 12 with a single injector 18 extending in the longitudinal direction above the cylindrical evaporation chamber 16. The nozzle 30 of the injector 18 sends a jet of liquid JL directed coaxially into the evaporation chamber 16.

Figure 3:
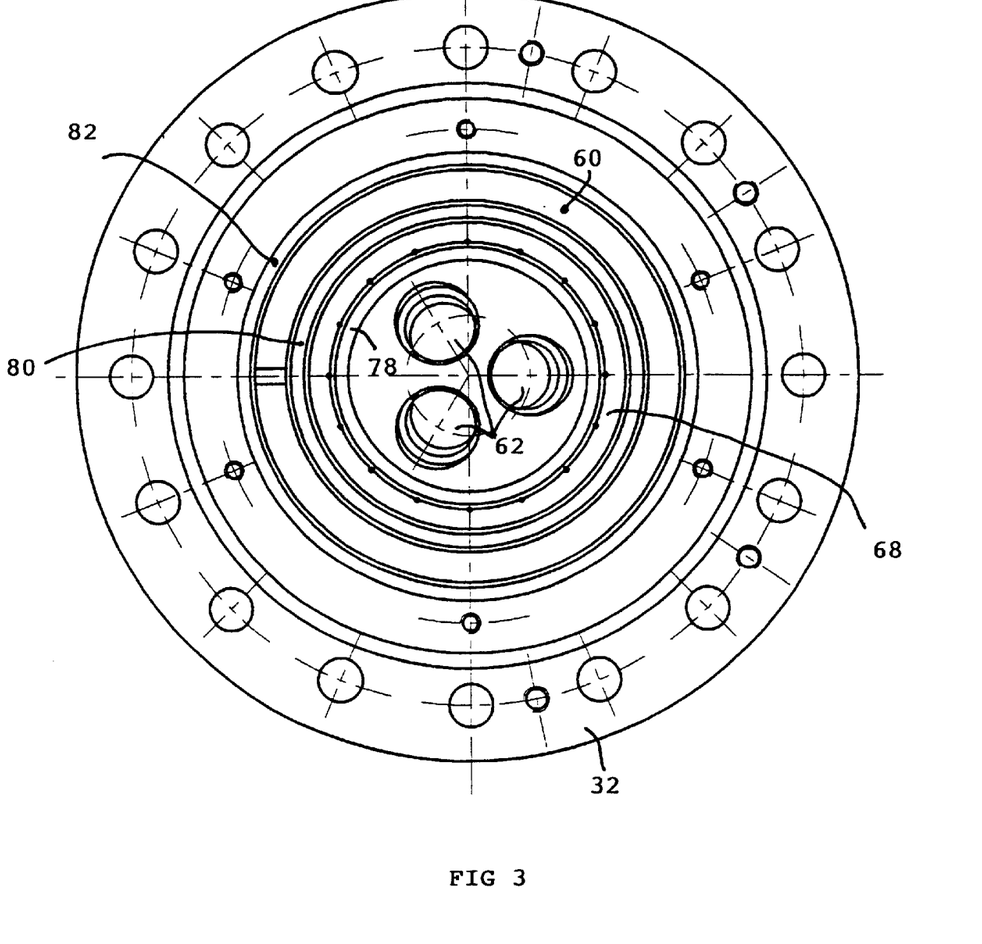
FIG. 3 represents a top view on an enlarged scale along the line 3—3 of the injection flange of FIG. 1.
Figure 4:
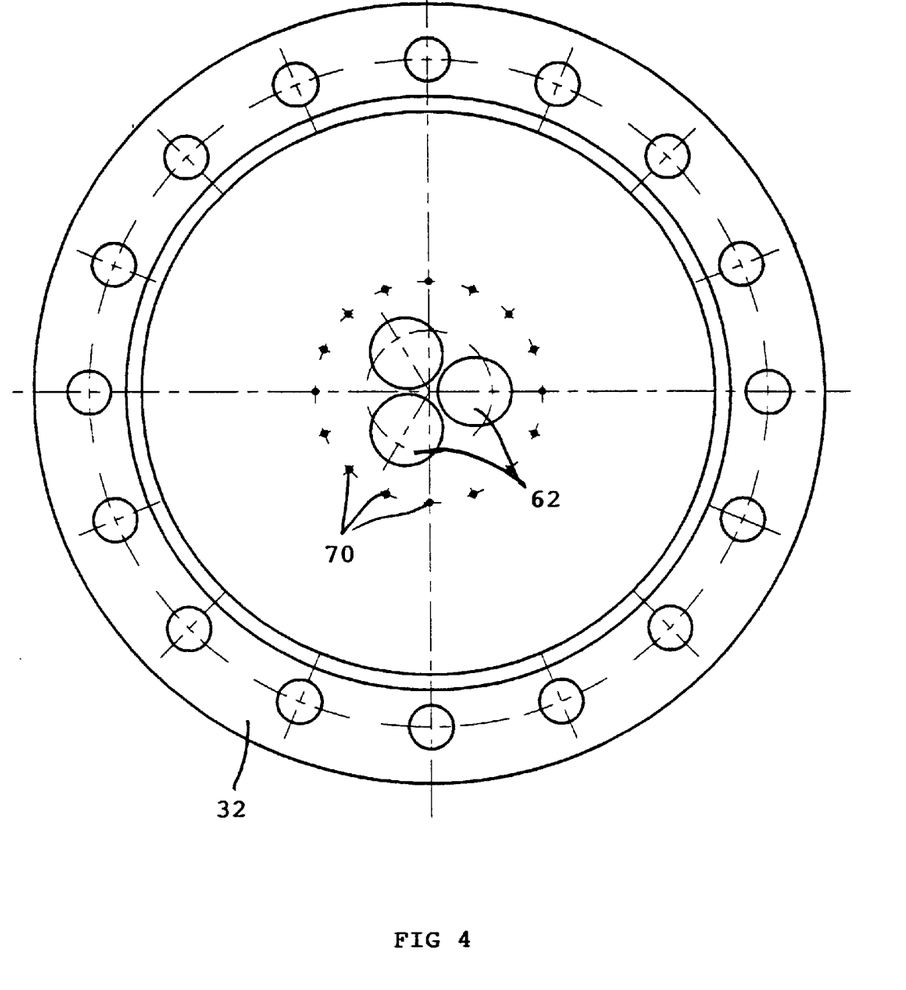
FIG. 4 represents a bottom view on an enlarged scale along the line 4—4 of the injection flange of FIG. 1.
Figure 5:
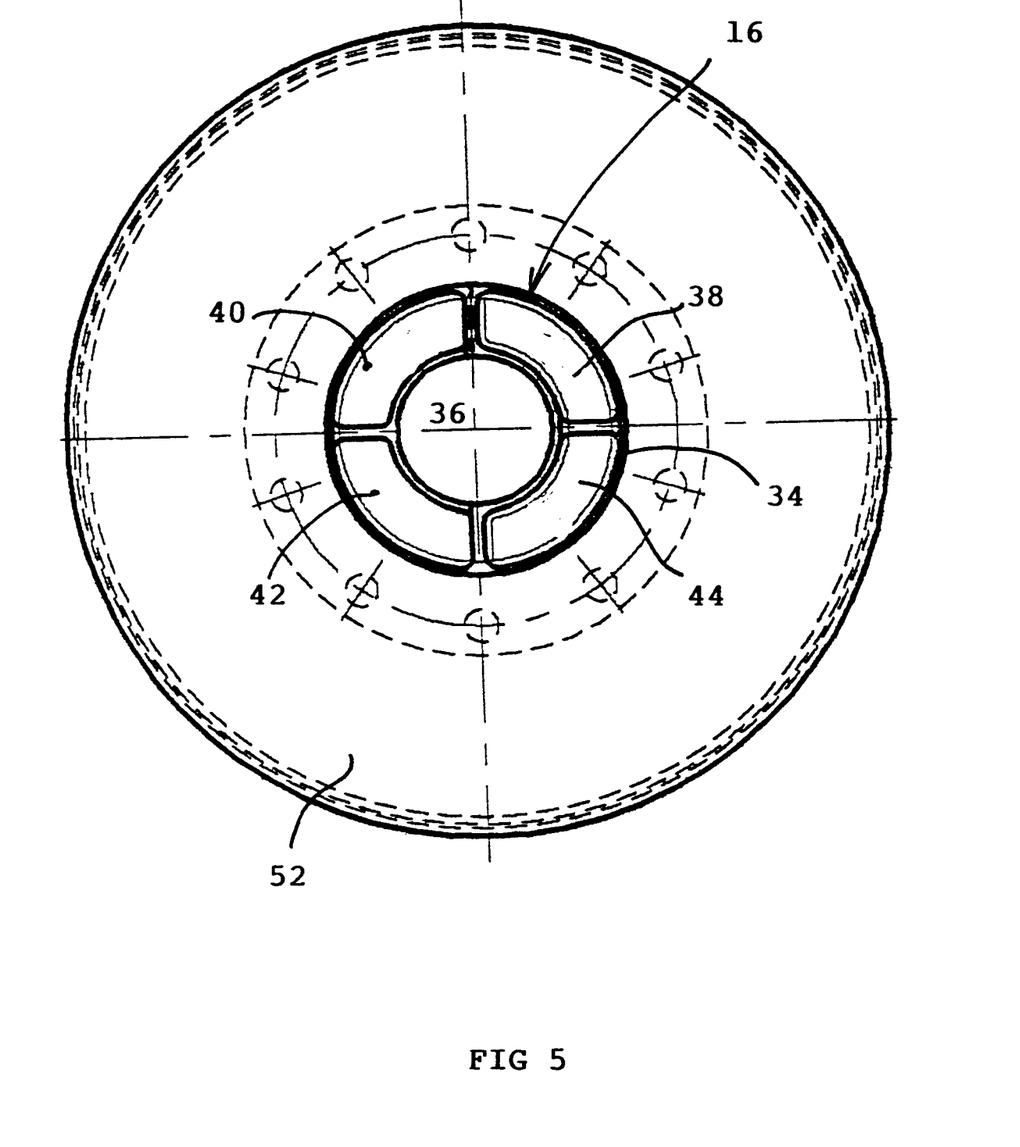
FIG. 5 is a cross-sectional view along the line 5—5 of FIG. 1.

In the embodiment of FIGS. 1, 3 and 4, the inlet head 12 comprises three injectors 18 mounted inclined in the central part of a cylindrical flange 32. The three jets of liquid JL converge towards the central part at the inlet of the evaporation chamber 16.

The angle of incline of the injectors 18 with respect to the longitudinal axis can be comprised between 0 and 90°.

The outlet tube 14 is designed to be connected by a heated line to a chemical vapour deposition CVD reactor (not represented), which is equipped with a pumping system or a vent enabling a vapour flow to be generated from the liquid delivery apparatus 10 to the reactor. A substrate on which the deposition is to be made is placed in the reactor.

The arrangement of the liquid delivery apparatus 10 ensures that total evaporation of the injected liquid takes place before final outlet via the outlet tube 14. The evaporation chamber 16 is provided for this purpose with deviation means so that the distance covered by the droplets or vapours is greater than the distance in a straight line between the nozzle 30 of the injector 18 and the outlet tube 14.

The evaporation chamber 16 is formed for example by a metallic tube 34 made of stainless steel, subdivided by machining into a plurality of internal channels 36, 38, 40, 42, 44 extending in the longitudinal direction of the tube. The liquid is injected from each injector 18 into the central channel 36 and the droplets and vapours descend (arrow F1, FIGS. 1 and 5) in the course of evaporation to the bottom part where they are deviated by a first guide part 46 to two neighbouring channels 38, 44. After they have risen (arrow F2) to the upper part, they are again deviated by a second guide part 48 to take the other two channels 40, 42 in the downward direction (arrow F3) to the outlet tube 14. Such a path with chicanes enables the distance travelled and the heating surface in the evaporation chamber 16 to be increased. The volume of the five channels 36, 38, 40, 42, 44 of the tube 34 enables the effects of the pressure increase in the evaporation chamber 16 due to evaporation of the liquid to be attenuated at the level of the CVD reactor.

It is clear that the evaporation chamber 16 can be made of other materials, in particular glass or quartz tubes welded to one another.

The evaporation effect of the liquid can also be increased by arranging in the channels 36, 38, 40, 42, 44 a plurality of metallic grates or porous sintered glass plates, extending parallel to one another and in a direction perpendicular to the flow of liquid and vapours. The presence of these grates or additional plates along the flow path of the liquid reduces the size of the liquid droplets and increases the heated surface of the evaporation chamber 16.

Figure 7:
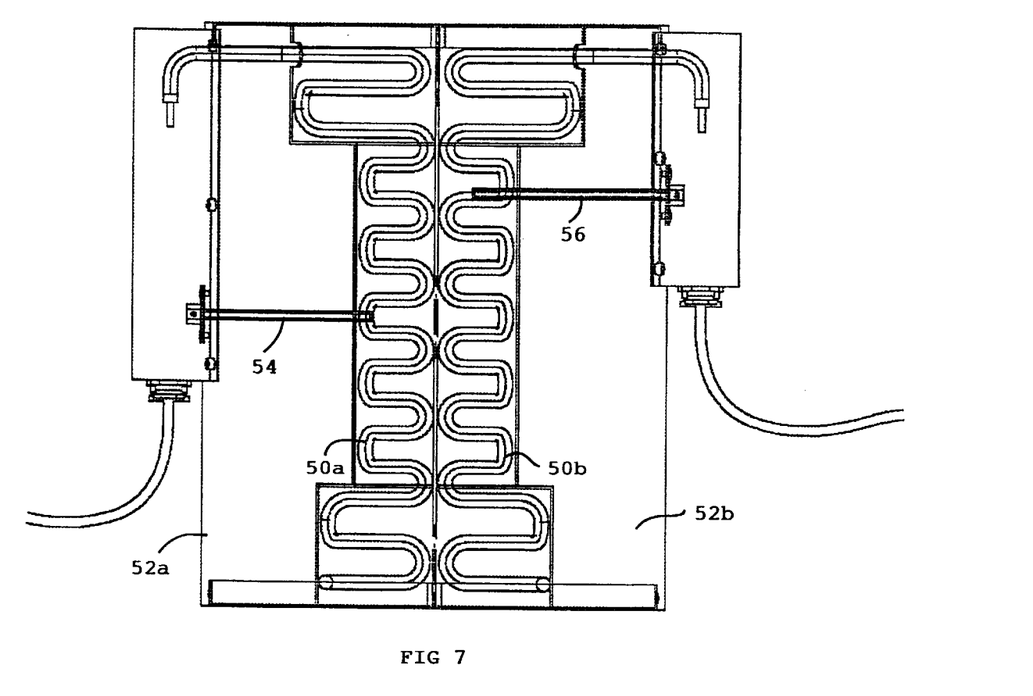
FIGS. 7 and 8 are elevational and plane views of the tubular heating furnace of the evaporator apparatus.
Figure 8:
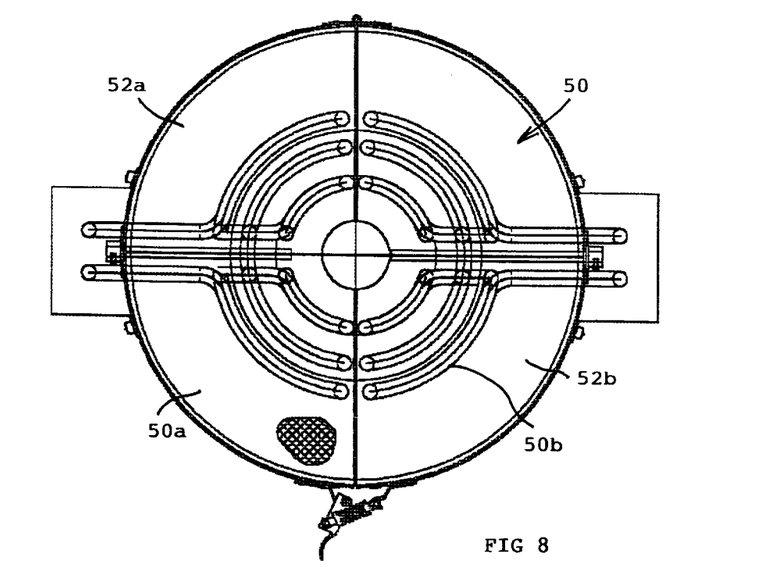

The evaporator apparatus 10 comprises in addition heating means 50 housed in a tubular enclosure 52 made of thermal insulating material coaxially surrounding the lateral surface of the tube 34. In FIGS. 7 and 8, the enclosure 52 is formed by adjoinment of two half-shells 52a, 52b of semi-cylindrical cross-sections, each having an internal surface receiving an electrical resistance 50a, 50b extending over the whole height of the evaporator apparatus 10. The two resistances 50a, 50b of the heating means 50 can be connected in series or in parallel depending on the electrical power required. The evaporator apparatus 10 comprises in addition a pair of thermocouples 54, 56 housed in the enclosure 52 to measure the temperature at two locations of the chamber 16. The thermocouple 56 placed inside the tube serves the purpose of regulating the temperature of the evaporator apparatus 10. The other thermocouple 54 enables the temperature of the resistance 50 to be monitored.

The coaxial arrangement of the two half-shells 52a, 52b of the furnace around the evaporation chamber 16 enables a compact assembly to be obtained, which can be easily disassembled when cleaning operations are performed, in particular of the evaporation chamber 16.

The whole of the heating zone around the tube 34 is thermally insulated from the outside environment by the enclosure 52 so as to increase the thermal efficiency of the system. With a single heating zone, a positive temperature gradient is thus obtained along the path of the vapours, which is established from the core of the evaporation chamber 16 in the channel 36 to the external channels 38, 40, 42, 44.

Heating of the liquid must only take place from the time it has been injected into the evaporation chamber 16. Cooling means of each injector 18 or spray nozzle simply have to be provided either by means of a cooling circuit 58 with water or coolant or by the action of a fan (not represented) blowing air towards the flange 32.

In FIGS. 2 to 4, the flange 32 of the inlet head 12 is equipped for this purpose with an annular throat 60 arranged around the orifices receiving the injectors 18. The throat 60 is connected by pipes 64 to the cooling circuit 58 so as to cool the injectors 18. The orifices 62 pass through the whole thickness of the flange 32 and the injectors 18 are inserted in the orifices 62 with a seal 66 fitted between these two elements. When the coolant flows in the throat 60, the injectors 18 remain cold.

To prevent any condensation of the evaporated products on a cold zone inside the evaporation chamber 16, a vector gas is injected into the chamber simultaneously with injection of the liquid. The gas circuit comprises an annular groove 68 arranged in the flange 32 between the throat 60 and the orifices 62. The bottom of the groove 68 communicates with the evaporation chamber 16 via holes 70 uniformly distributed over the whole circumference of the ring for injection of vector gas jets JG. Gas supply of the groove 68 is performed by a duct 72 connected to a tank 74 filled with gas. An annular gas sheath is thus present around the liquid jet JL injected by the injector 18 of FIG. 2 or by the three injectors 18 of FIGS. 3 and 4. A cover 76 is fitted on the flange 32 with three seals 78, 80, 82 placed between the throat 60, the groove 68 and the orifices 62.

Simultaneous injection of the liquid and vector gas into the evaporation chamber 16 enables optimum evaporation and efficient transportation of the precursor vapours to the deposition zone in the reactor. For specific processes, the gas line can be heated up-line from the duct 72 and the vector gas enters the evaporation chamber 16 either at ambient temperature or at a higher temperature.

Figure 6:
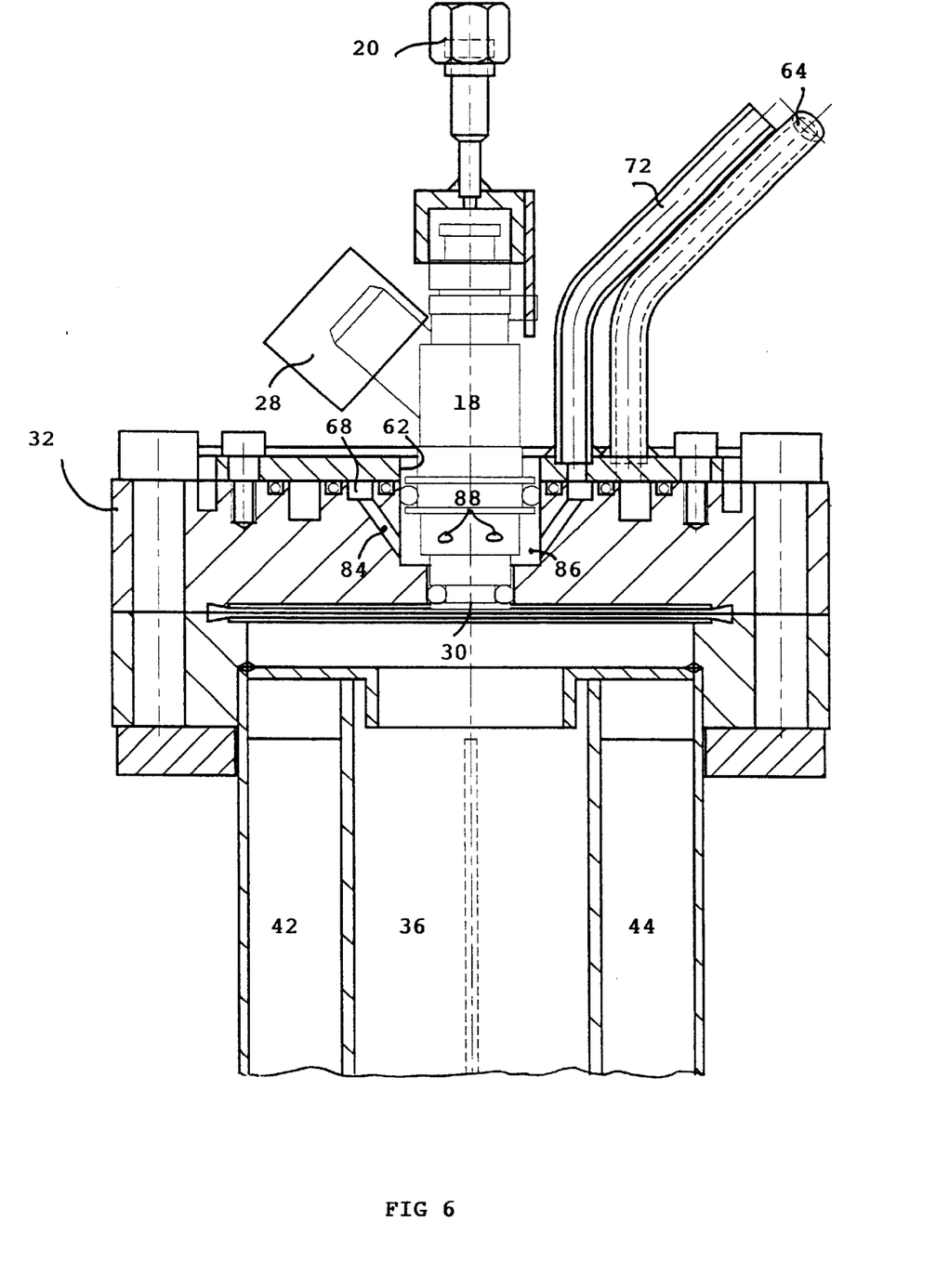
FIG. 6 is an identical view to FIG. 2 of an alternative embodiment.

According to the alternative embodiment of FIG. 6, the injector 18 serves the purpose of injecting the gas and liquid simultaneously without mixing them. The groove 68 of the gas circuit is connected by passages 84 to an annular space 86 arranged around the nozzle of the injector 18. Orifices 88 are provided in the body of the injector 18 to enable the gas to enter inside the injector 18. The nozzle 30 of the injector 18 then sends two combined jets of liquid and gas into the evaporation chamber 16.

According to an alternative embodiment (not represented), the injector or injectors 18 are not placed at the upper part of the inlet head 12 but on the side. Deviating plates are provided in the evaporation chamber to ensure that the gasified precursors take a zig-zag path.

With reference to the alternative embodiment illustrated in FIGS. 9 to 12, recondensation in the evaporator can be prevented by heating the evaporator uniformly in the radial direction and the longitudinal direction. Each of the four injectors 18 has to remain cold to prevent breakdowns of the products before injection.

Figure 9:
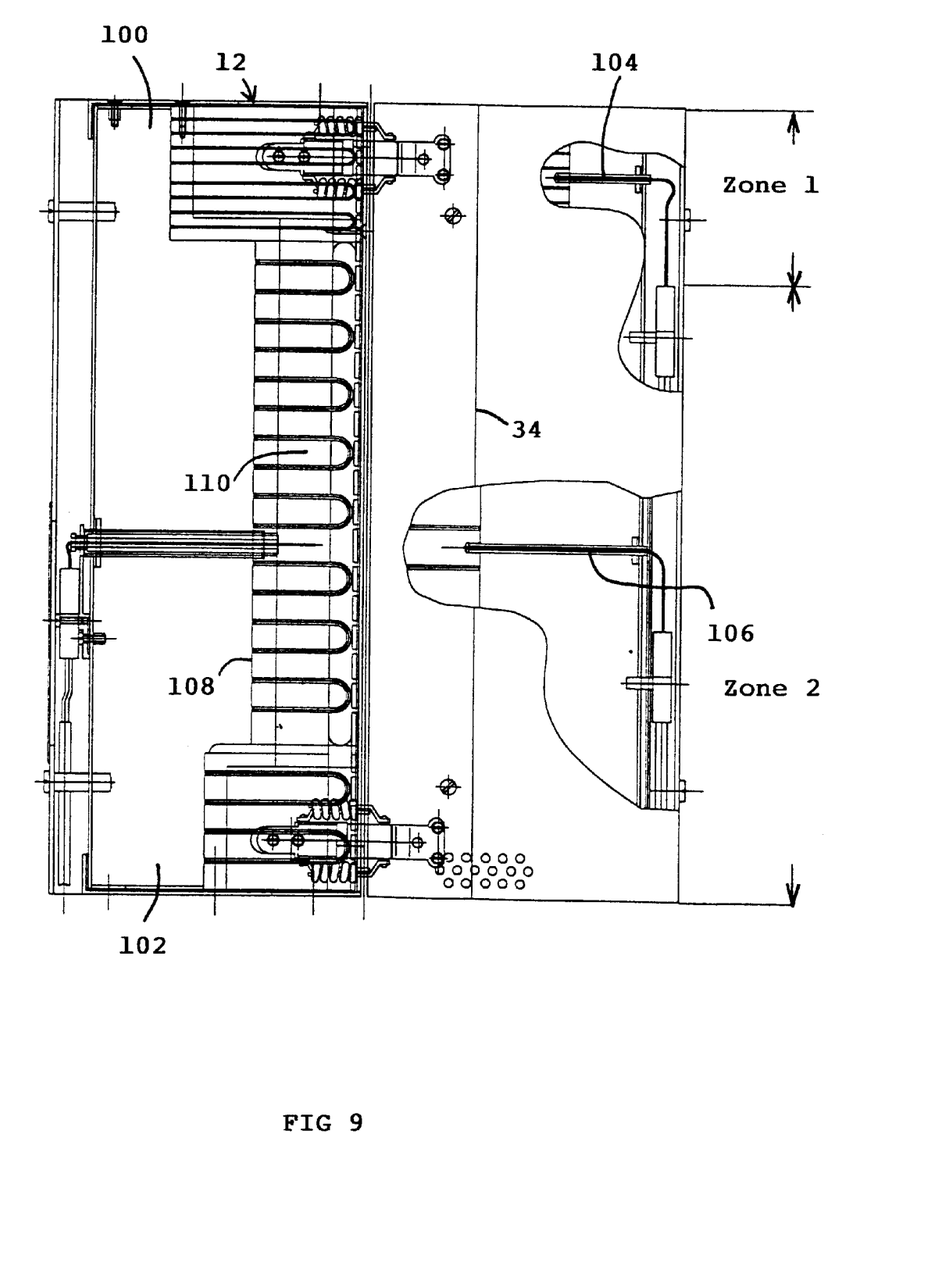
FIG. 9 is an elevational view of an alternative embodiment of the furnace.

The furnace of FIG. 9 presents several heating zones designed to independently control the thermal energy inputs on the upper flange 100 of the inlet head 12, the lower flange 102 surrounding the outlet tube, and the tube 34. The first zone 1 heats the upper flange 100 and the second zone 2 heats the tube 34 and the lower flange 102. The temperature in each of the heating zones 1, 2 is controlled by a thermocouple 104, 106.

To improve the heat transfer on the body of the evaporator, the resistances 108 are inserted in machined grooves arranged in two aluminium half-shells 110 following exactly the same tubular shape as the body of the evaporator. Indirect heating of the stainless steel tube of the evaporator through the aluminium enables a uniform temperature of the evaporator to be obtained, on account of the fact that the thermal conductibility of aluminium is higher than that of stainless steel.

Figure 10:
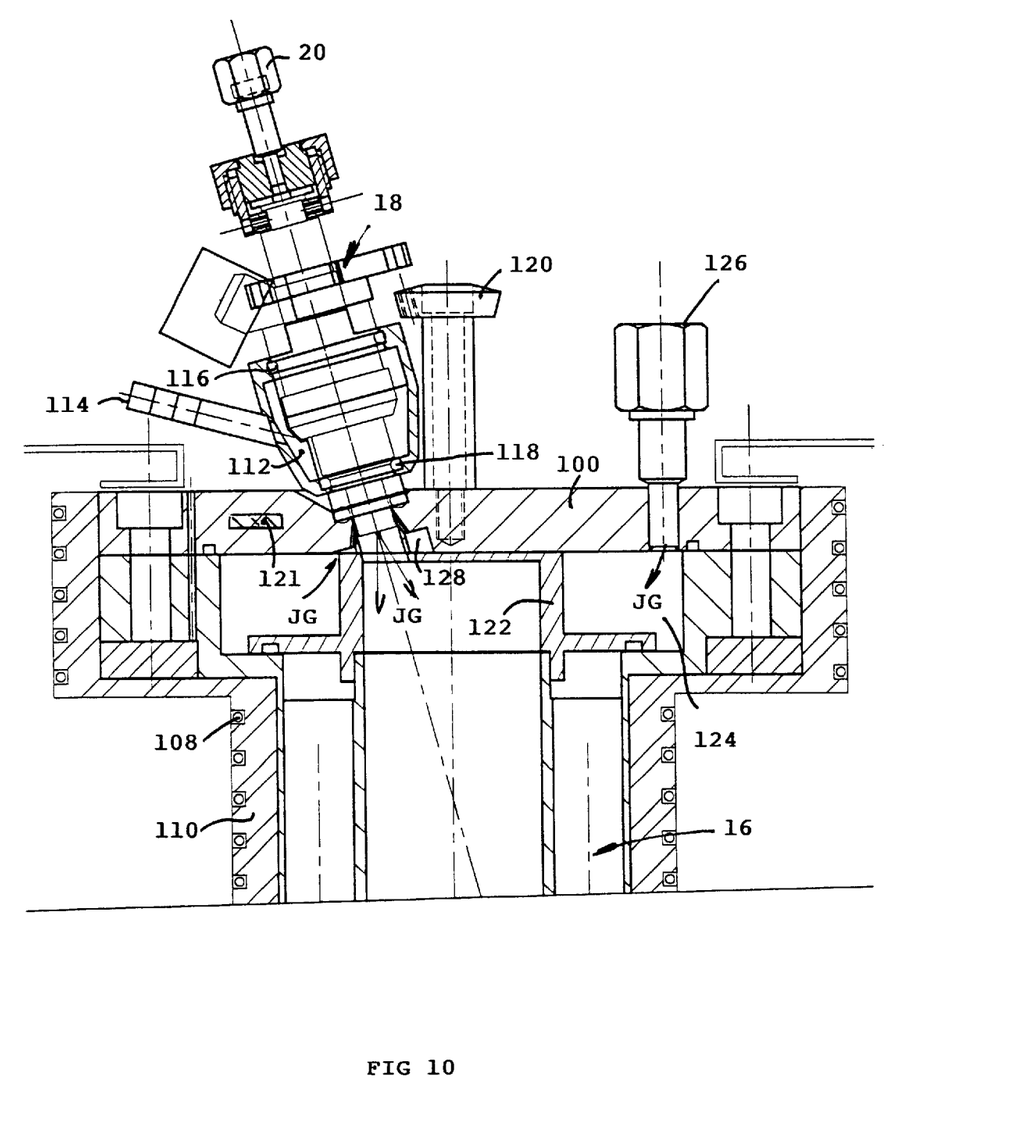
FIG. 10 is a cross-sectional view of an evaporator with four injectors, only one injector being illustrated.
Figure 11:
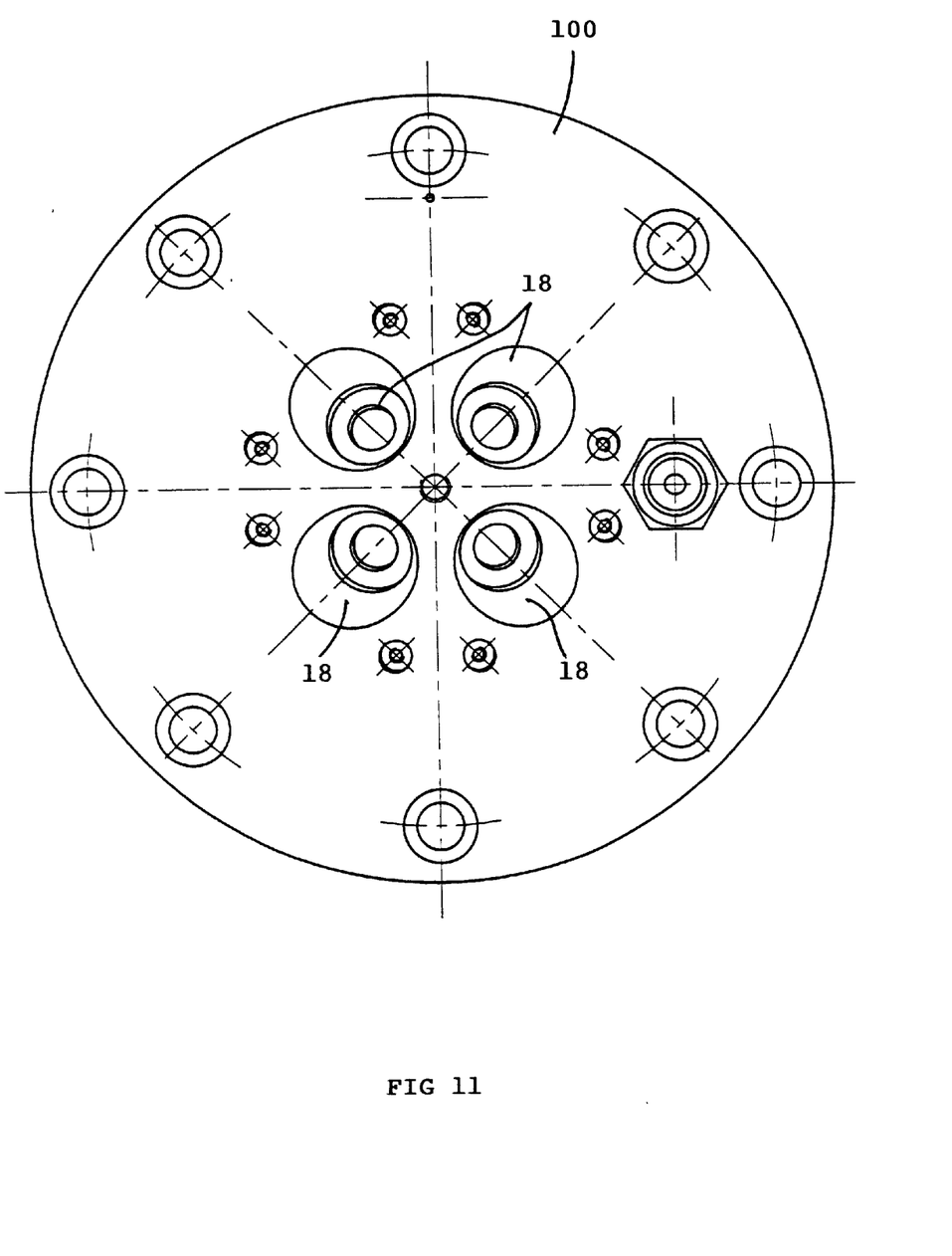
FIGS. 11 and 12 are top and bottom views of the flange of the evaporator of FIG. 10.
Figure 12:
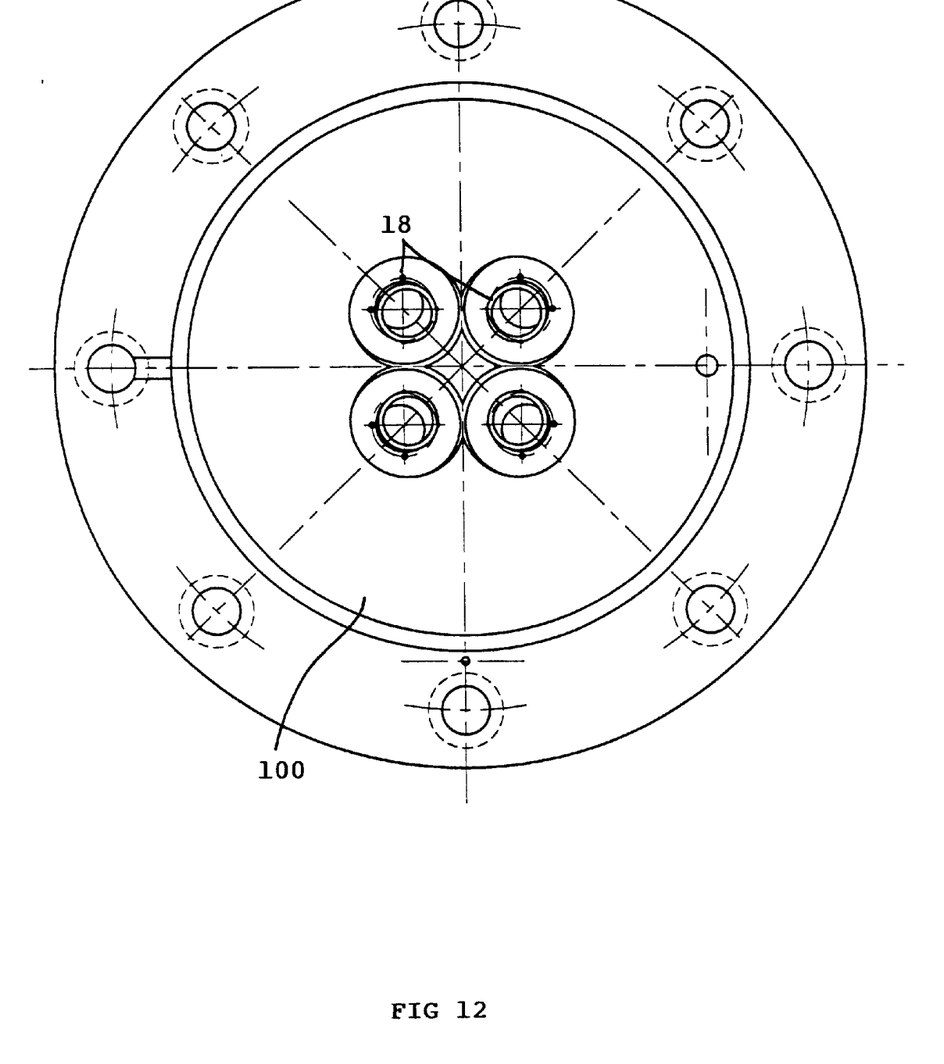

In FIGS. 10 to 12, instead of the cooling circuit of the injectors 18 being provided in the flange 100 of the inlet head 12, each injector 18 has an individual cooling circuit which is formed by an annular space 112 filled with a coolant inserted via an orifice 114. The space 112 is made tight by fitting of two seals 116, 118 interposed with the body of each injector 18. A stainless steel stud 120 enables the injectors 18 and their cooling circuits to be fixed onto the flange 100. The flange 100 can thus be heated more efficiently to prevent condensation. Electrical resistances 121 can be integrated for this purpose in the upper flange 100 to generate an auxiliary heating in addition to that of the first zone 1 of the furnace.

An annular collar-piece 122 extends up to the bottom face of the flange 100 to minimize the surface accessible for backstreaming and condensation. Evaporation of the liquid injected by the injectors 18 is optimized by making the vector gas as hot as possible, and by making it enter at the level of the nozzle of the injectors 18. The gas is injected via an orifice 126 into the annular volume 124 (arrow JG) where it expands and is heated before being reinjected into the space 128 near to the nozzle of each injector 18.

The injectors 18 can operate in pulsed manner (case of an automobile injector), or in continuous manner (case of an ultrasound spray nozzle which creates a continuous aerosol flow).

The internal walls of the evaporation chamber 16 can be covered with a chemically inert deposit, for example silicon carbide or tungsten, to prevent breakdown reactions of the vapours in contact with the metallic walls. These reactions are catalysed by the potential presence of a thin layer of oxides at the surface of the steel or aluminium. The inert deposit enables these oxides to be masked.

The evaporator can also be used in organic chemistry to create vapours which become the reagents of chemical vapour reactions without the intervention of a substrate.

What is claimed is:

1. An apparatus for liquid delivery into a chemical vapour deposition CVD installation or into a chemical vapour reaction reactor, comprising:

an inlet head equipped with at least one injector or spray nozzle having an inlet for delivery of liquid precursors or precursors in solution;

a control circuit to periodically inject droplets of predetermined volume of the liquid precursors or a continuous or pulsed aerosol flow into an evaporation chamber;

injection means for injecting a vector gas into said evaporation chamber;

heating means designed to heat the evaporation chamber to achieve the change of liquid/vapour state of the liquid precursors, or of the solvent and precursor solution;

an outlet tube designed to send the vaporised injected precursors to a reactor of the chemical vapour deposition CVD installation;

at least one orifice in a central part of the inlet head for insertion of the injector;

a circuit for injection and heating of the vector gas simultaneously with injection of the liquid, the vector gas being directed to the vicinity of the injector; and cooling means for cooling the injector, by at least one of water, coolant flow, and blown air.

2. The apparatus for liquid delivery according to claim 1, wherein the evaporation chamber contains deviation means arranged so that the distance covered by the droplets and vapours of the precursors is greater than the distance in a straight line between the nozzle of the injector and the outlet tube.

3. The apparatus for liquid delivery according to claim 2, wherein the deviation means of the liquid precursors are formed by chicanes inside a tube subdivided into a plurality of elementary channels to increase the path and heating surface in the evaporation chamber.

4. The apparatus for liquid delivery according to claim 3, wherein the internal walls of the channels are covered with a chemically inert deposit to prevent catalytic breakdown reactions of the vapours in contact with the metallic walls.

5. The apparatus for liquid delivery according to claim 4, wherein the chemical inert deposit comprises one of silicon carbide and tungsten.

6. The apparatus for liquid delivery according to claim 3, wherein the heating means surround the lateral surface of the tube coaxially to confine at least one heating zone thermally insulated from the outside by a tubular enclosure made of thermal insulating material.

7. The apparatus for liquid delivery according to claim 6 wherein the heating means comprise resistances inserted in machined grooves arranged in two aluminium half-shells following exactly the same shape as the body of the evaporator so as to generate indirect heating of the tube.

8. The apparatus for liquid delivery according to claim 6, comprising a first heating zone which heats the upper flange, and at least one second heating zone which heats the tube and the lower flange, the temperature in each heating zone being controlled by a thermocouple.

9. The apparatus for liquid delivery according to claim 8, wherein at least one electrical resistance is integrated in either the upper flange or the lower flange to generate an auxiliary heating in addition to that of the first or second zone of the furnace.

10. The apparatus for liquid delivery according to claim 8, wherein an annular collar-piece extends up to the bottom face of the flange in the injection zone to minimize the surface accessible for backstreaming and condensation, the vector gas being injected via an orifice into an annular volume arranged around the collar-piece where it expands and is heated before being reinjected into the space near to the nozzle of each injector.

11. The apparatus for liquid delivery according to claim 6, wherein the enclosure of thermal insulating material is formed by adjoinment of two semi-cylindrical half-shells, each having an internal surface receiving an electrical resistance extending over the whole height of the tube.

12. The apparatus for liquid delivery according to claim 2, wherein the tube is made of metallic material.

13. The apparatus for liquid delivery according to claim 12, wherein the metallic material comprises one of stainless steel and aluminum.

14. The apparatus for liquid delivery according to claim 1, wherein the tube is made of glass or quartz.

15. The apparatus for liquid delivery according to claim 1, wherein each injector has an individual cooling circuit, which is formed by an annular space filled with a coolant.

16. The apparatus for liquid delivery according to claim 1, wherein a groove is supplied with vector gas by a tank and comprises holes in the bottom passing through the inlet head, and distributed uniformly over the whole circumference to form an annular vector gas sheath around the liquid jet injected by the injector.

17. The apparatus for liquid delivery according to claim 16, wherein the groove communicates via passages with an annular space arranged around the nozzle of the injector, and that holes are provided in the body of the injector to enable the gas to be injected by the injector, but into a circuit independent from that of the liquid.

* * * * *